United States Patent

Ito

Patent Number: 5,818,083
Date of Patent: Oct. 6, 1998

[54] SEMICONDUCTOR MEMORY DEVICE HAVING A FLOATING GATE

[75] Inventor: Takashi Ito, Kawasaki, Japan

[73] Assignee: Fujitsu Limited, Kawasaki, Japan

[21] Appl. No.: 825,057

[22] Filed: Mar. 27, 1997

Related U.S. Application Data

[63] Continuation of Ser. No. 521,461, Aug. 30, 1995, abandoned, which is a continuation of Ser. No. 108,494, Aug. 18, 1993, abandoned.

[30] Foreign Application Priority Data

Aug. 19, 1992 [JP] Japan .................................. 4-220122

[51] Int. Cl.⁶ .................. H01L 29/788; H01L 29/76; H01L 31/036; H01L 31/112
[52] U.S. Cl. ........................................ 257/321; 257/66
[58] Field of Search ................................. 257/347, 321, 257/322, 66

[56] References Cited

U.S. PATENT DOCUMENTS

| | | | |
|---|---|---|---|
| 4,608,585 | 8/1986 | Keshtbod | 257/322 |
| 5,096,854 | 3/1992 | Saito et al. | 437/225 |
| 5,111,260 | 5/1992 | Malhi et al. | 257/347 |
| 5,264,721 | 11/1993 | Gotou | 257/347 |

FOREIGN PATENT DOCUMENTS 61-256674  11/1986  Japan ..................................... 257/322

*Primary Examiner*—Stephen Meier
*Attorney, Agent, or Firm*—Nikaido, Marmelstein, Murray & Oram LLP

[57] ABSTRACT

A floating gate semiconductor memory device comprises a polycrystal semiconductor substrate provided on an insulating substrate, and a floating gate electrode and a control gate electrode are provided on the polycrystal semiconductor substrate with an intervening tunneling oxide film. The polycrystal semiconductor substrate is formed by recrystallizing an amorphous semiconductor layer deposited on the insulating substrate by a thermal annealing process. The tunneling oxide film has a reduced thickness for allowing tunneling of electrons therethrough.

9 Claims, 9 Drawing Sheets

PHOTOGRAPH 1

SEMICONDUCTOR MEMORY DEVICE HAVING A FLOATING GATE

This application is a continuation of application Ser. No. 08/521,461, filed Aug. 30, 1995, now abandoned, which in turn is a continuation of application Ser. No. 08/108,494, filed Aug. 18, 1993, now abandoned.

BACKGROUND OF THE INVENTION

The present invention generally relates to semiconductor devices and more particularly to a semiconductor memory device having a floating gate.

With spread use of computers in the human society, there is an increased demand for high speed, large capacity, and reliable memory devices for storing information. Generally, computers use high-speed semiconductor memories such as dynamic random access memories and static random access memories for the main storage device while magnetic disk devices are used for large capacity, but auxiliary storage devices. Generally, magnetic disk devices have an access speed much slower than the access speed of semiconductor memory devices, while the storage capacity of the magnetic disk devices supersedes the storage capacity of the semiconductor memory devices.

On the other hand, with the recent rapid development of so-called flash memories, attempts have been made to realize such a large capacity non-volatile semiconductor memories as an alternative of bulky and fragile magnetic disk devices. A flash memory has a structure similar to a MOS transistor in that source and drain regions are formed on a single crystal semiconductor substrate with a channel region intervening therebetween, and a control electrode is provided above the semiconductor substrate in correspondence to the channel region. The flash memory is characterized by an insulated floating gate provided between the control gate and the substrate for storing information in the form of electric charges. The floating gate retains the electric charges injected thereto with little leakage. When writing information, a control voltage is applied to the control electrode to modify the potential level thereof. Thereby, the electric charges are injected into the floating gate through a thin tunneling oxide film provided between the floating gate and the surface of the substrate, in the form of Fowler-Nordheim tunneling current. When erasing information, an erasing voltage is applied to the source region of the device and the electric charges held in the floating gate are dissipated to the source region by causing a tunneling through the tunneling oxide film. On a semiconductor chip, the flash memories have the source regions connected commonly with each other, and such an erasing of information is achieved simultaneously for the entire devices that are provided on the same semiconductor chip.

Thus, intensive efforts are being made to increase the storage capacity of the flash memories and to reduce the fabrication cost of the device such that the device can successfully replace conventional magnetic disk devices. It should be noted that flash memories posses advantageous features such as solid mechanical construction, small outer dimension, little electric power consumption, and high access speed that are pertinent to semiconductor memories. Thus, flash memories having a storage capacity of several megabytes or more are now becoming available commercially.

On the other hand, in order to expand the use of non-volatile semiconductor memories further, further reduction of fabrication cost and further increase in the integration density are indispensable. In this view point, it is expected that the fabrication cost of conventional flash memories, which are constructed on a single crystal silicon substrate, cannot be decreased dramatically, in spite of intensive efforts to reduce the fabrication cost of the device.

As a technology to integrate a huge number of transistors on a common substrate with very cheap cost, there exists a fabrication process of TFT transistors that uses a glass substrate. In the TFT transistors, a polysilicon layer is deposited on the glass substrate as an active layer of the device. Thereby, the fabrication cost of the individual transistors is dramatically decreased. Thus, the TFT transistors are used for switching individual pixels in LCD display devices.

Thus, it is expected that the technique of TFT may be employed for fabricating low cost non-volatile semiconductor memories of very large storage capacity, by providing a-floating gate structure on such a glass substrate, such that the flash memories are formed on such a glass substrate.

However, the flash memories, relying upon the Fowler-Nordheim tunneling of carriers through the thin tunneling oxide film that covers the substrate, cannot exhibit the desired injection or removal of the carries to and from the floating gate when constructed on such a polycrystalline substrate. It should be noted that the effect of gain boundary of the polycrystal substrate results in an irregular surface morphology that in turn is transferred to the thin tunneling oxide film which is essential to the operation of flash memories. Such a irregularity in the surface of the substrate may result in a heterogeneous or non-uniform concentration of electric field in the tunneling oxide film that may eventually lead to the breakdown of the oxide film or deteriorated retention of electric charges in the floating gate electrode.

Thus, it is expected that mere combination of the TFT technology with the technology of flash memories to realize low cost, large capacity non-volatile semiconductor memories is generally unsuccessful. Although the techniques are known to provide so-called SOI (semiconductor-on-insulator) structures, as in the case of SIMOX process, with a quality of the semiconductor substrate suitable for constructing a flash memory thereon, conventional SOI structures are very expensive in view point of large capacity semiconductor memory devices that are subjected to very stringent demand for cost reduction.

SUMMARY OF THE INVENTION

Accordingly, it is a general object of the present invention to provide a novel and useful semiconductor memory device wherein the foregoing problems are eliminated.

Another and more specific object of the present invention is to provide a low cost, large capacity non-volatile semiconductor memory device that has a polycrystal substrate provided on an insulating substrate Another object of the present invention is to provide a semiconductor memory device for storing information in the form of electric charges, comprising:

an insulating substrate having upper and lower major surfaces;

a polycrystalline semiconductor substrate having upper and lower major surfaces and provided on said upper major surface of said insulating substrate; and a gate structure provided on said upper major surface of said polycrystalline semiconductor substrate, said gate structure including:

a tunneling oxide film provided on said upper major surface of said polycrystalline semiconductor substrate, said tunneling oxide film having a thickness to allow carriers to pass therethrough by a tunneling effect;

a floating gate electrode provided on an upper major surface of said tunneling oxide film, said floating gate electrode storing information in the form of electric charges;

an intervening insulation film provided on an upper major surface of said tunneling oxide film; and a control electrode provided on an upper major surface of said intervening insulation film.

Another object of the present invention is to provide a process for fabricating a non-volatile semiconductor memory device that has a floating gate electrode for storing information therein in the form of electric charges, said method comprising the steps of:

depositing an amorphous semiconductor layer on an upper major surface of an insulating substrate, by decomposing a gaseous source material of said amorphous semiconductor layer on said upper major surface of said insulating substrate;

crystallizing said amorphous semiconductor layer by annealing said insulating substrate form a polycrystal semiconductor layer;

providing an insulation layer on an upper major surface of said polycrystal semiconductor layer with a thickness met to allow tunneling of carriers therethrough, to form a tunneling oxide layer;

depositing a first conductor layer on said tunneling oxide layer to form said floating gate electrode;

providing an insulation layer on an upper major surface of said floating gate electrode to form an interlayer insulation film; and depositing a second conductor layer on an upper major surface of said interlayer insulating film to form a control gate electrode.

According to the present invention, one can form the upper major surface of the polycrystal semiconductor substrate with a surface irregularity of less than several Angstroms even at the grain boundary. Thereby, the tunneling oxide film can be formed with a substantially uniform thickness, and the problem of "leakage" of the electric charges from the floating gate electrode via the tunneling oxide film caused by the concentration of electric field is successfully eliminated. With the foregoing reduced surface irregularity, the thickness of the tunneling oxide film can be reduced to the order of about 10 nm, without problems. Further, one can eliminate the breakdown of the thin tunneling oxide film caused by localized concentration of the electric field.

Other objects and further features of the present invention will become apparent from the following detailed description when read in conjunction with the attached drawings.

BRIEF DESCRIPTION OF THE DRAWINGS

BRIEF DESCRIPTION OF PHOTOGRAPH

Photograph 1 shows a cross section of a semiconductor memory device of the present invention.

DETAILED DESCRIPTION OF THE PREFERRED EMBODIMENTS

Figure 1:
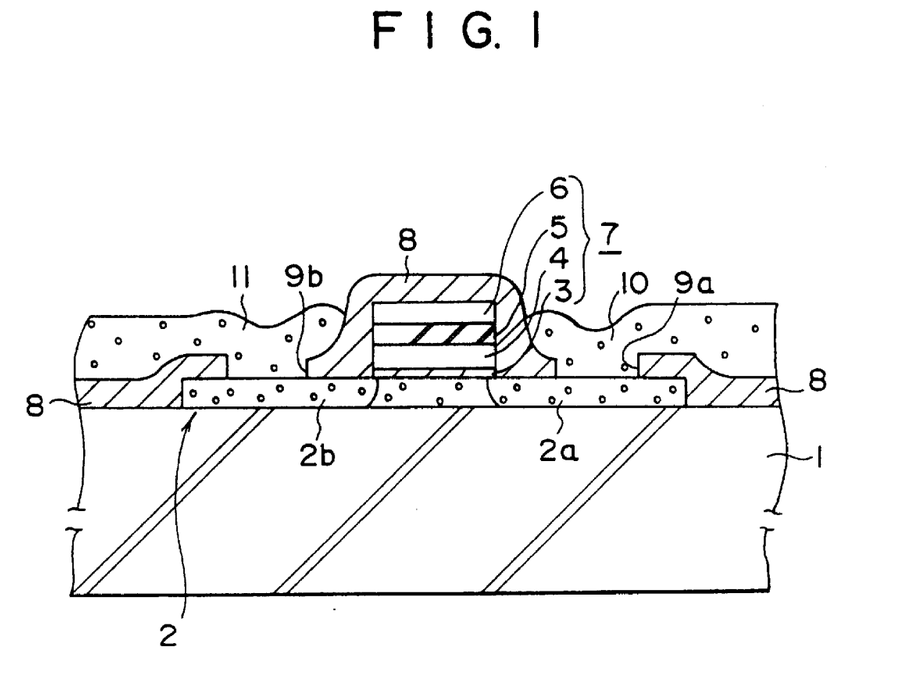
FIG. 1 is a diagram showing a memory cell transistor according to a first embodiment of the present invention.

FIG. 1 shows the structure of a non-volatile semiconductor memory according to a first embodiment of the present invention.

Referring to FIG. 1, the device forms a flash memory cell transistor and is constructed on an insulating substrate 1 typically of a quartz glass, although high-melting glasses of other compositions may also be used. On an upper major surface of the glass substrate 1, there is provided an n-type polysilicon substrate layer 2 with a thickness of about 0.1 $\mu$m or less, such that the layer 2 has a substantially flat upper major surface in correspondence to the mirror-flat upper major surface-of the glass substrate 1. As will be described later in detail, the polysilicon substrate layer 2 is formed by crystallizing an amorphous silicon layer deposited on the glass substrate 1 by a CVD process, and has a surface roughness or irregularity of less than 10 Angstroms (1 nm), typically less then several Angstroms. In the illustrated example, the polysilicon substrate layer 2 is doped by P and has a carrier concentration level of about $10^{17} cm^{-3}$.

On the upper major surface of the polysilicon substrate layer 2, there is provided a tunneling oxide film 3 of silicon oxide with a thickness of about 10 nm or less, and a floating gate electrode 4 of polysilicon is provided on the tunneling oxide film 3. Thereby, the thickness of the tunneling oxide film 3 is reduced sufficiently such that the electrons can be injected from the polysilicon substrate layer 2 to the floating gate electrode 4 or vice versa, through the tunneling oxide film 3.

The floating gate electrode 4 has an upper major surface covered by-a silicon nitride insulation film 5 with a thickness of about 30 nm, and a control gate electrode 6 of polysilicon doped with a high impurity concentration level such as $10^{20} cm^{-3}$, is provided on the floating gate electrode 4 with a thickness of about 0.3 $\mu$m, as a control gate electrode.

Thereby, the layers 3–6 are patterned to form a gate structure 7 having a gate length of about 0.5 $\mu$m, and the gate structure 7 thus formed is buried under a silicon oxide protective layer 8 that is deposited on the polysilicon substrate layer 2 including the gate structure 7. Further, the silicon oxide protective layer 8 is provided with a pair of contact holes 9a and 9b at both sides of the gate structure 7, and polysilicon conductor patterns 10 and 11, deposited and patterned on the protective layer 8, establish an ohmic contact with the exposed upper major surface of the polysilicon substrate layer 2 in correspondence to the contact holes 9a and 9b. Thereby, it should be noted that the contact holes 9a and 9b expose $n^+$-type source and drain regions 2a and 2b defined in the n-type polysilicon layer 2.

In the structure of FIG. 1, the electrons flowing through the polysilicon substrate layer 2 from the source region 2a at the contact hole 9a to the drain region 2b at the contact hole 9b, are injected into the floating gate electrode 4 upon application of a suitable positive voltage to the control electrode 5, by causing a tunneling through the tunneling oxide film in the form of the Fowler-Nordheim tunneling current. The electrons thus injected to the floating gate electrode 3 is retained stably therein until a large negative control voltage in applied to the control gate electrode 6, wherein the electrons dissipate from the floating gate electrode to the polysilicon substrate layer 2 in the form of the Fowler-Nordheim tunneling current. As long as the injected electrons are retained at the floating gate electrode 4, the potential caused by the retained electrons prohibits the passage of the electrons through the polysilicon substrate layer 2 from the contact hole 9a to the contact hole 9b, and the device thereby stores one-bit information. The operation for writing, erasing and reading of data will be described later in detail.

In the structure of FIG. 1, it should be noted that the electric charges injected to the floating gate electrode 4 is retained stably for a prolonged period of time, without leaking through the tunneling oxide film 3. It should be noted that the polysilicon substrate layer 2, formed by crystallizing an amorphous silicon layer, shows a substantially flat upper major surface in spite of the existence of grain boundary, and the absence of large projections or depressions on the upper major surface of the layer 2 eliminates the local concentration of electric fields. Thereby, it is believed that the leakage of the injected electric charges to the substrate layer 2 via the tunneling oxide layer 3 is effectively eliminated.

FIGS. 2(A)–2(D) show the fabrication process of the memory device of FIG. 1.

Figure 2A:
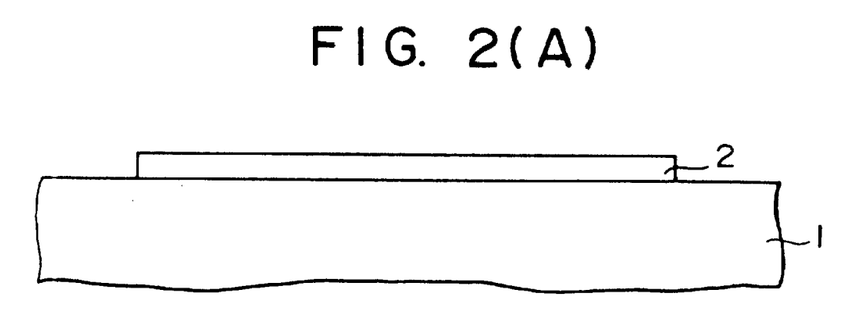
FIGS. 2(A)–2(D) are diagrams showing the fabrication process of the memory cell transistor of FIG. 1.

Referring to FIG. 2(A), an amorphous silicon layer 2 is deposited on the surface of the quartz glass substrate 1 by a CVD process that employs a thermal decomposition of monosilane at about 500° C. The amorphous silicon layer 2 is doped to the n-type by supplying phosphine simultaneously to the CVD process. Alternatively, the layer 2 may be doped by employing an ion implantation of $P^+$. Thereby, the amorphous silicon layer 2 is doped to the n-type with an impurity concentration level of about $10^{17} cm^{-3}$ as already explained.

During the CVD process, it is preferable to admix another source gas material containing F such as dichlorosilane ($SiH_2F_2$) to the foregoing monosilane gas to incorporate F into the network structure of amorphous silicon layer 2 thus grown. Thereby, the dangling bonds in the polymerized silicon network is effectively terminated, and one can reduce the defects in the polysilicon layer that is formed as a result of thermal annealing process of the layer 2 as will be described below.

The amorphous silicon layer thus formed is subjected, together with the quartz glass substrate 1, to a thermal annealing process conducted at 600° C. for about 20 hours while flowing nitrogen, such that the amorphous silicon layer is converted to a polysilicon layer. Thus, as a result of the thermal annealing process, the polysilicon layer 2 is formed. The polysilicon layer 2 thus obtained is then patterned to form a number of device regions, and the structure shown in FIG. 2(A) is obtained. As already noted, the polysilicon layer 2 thus obtained generally has a flat, smooth surface, with surface irregularities such as projections and depressions substantially smaller than about 10 nm, typically smaller than several nanometers. Depending on the necessity, one may apply a mechanical or chemical polishing process to obtain a substantially flat upper major surface for the polysilicon substrate layer 2. It should be noted that, as a result of the foregoing termination of the dangling bonds in the amorphous silicon network, the polysilicon layer 2 thus recrystallized is substantially free from defects that are caused as a result of the dangling bonds.

Figure 2B:
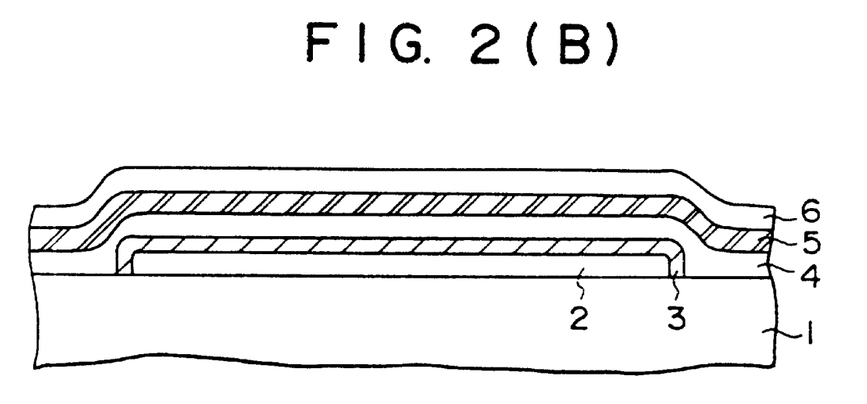

Next, in a step corresponding to FIG. 2(B), the structure thus obtained is subjected to a thermal annealing process in an oxidizing atmosphere at a temperature of about 900°–1000° C. for 10 minutes to form a silicon oxide film 3 on the surface of the polysilicon substrate layer 2 with a thickness of about 10 nm. Preferably, the surface of the silicon oxide film 3 thus formed is further treated by an ammoniac vapor at 1000° C. for 10 minutes to form an oxynitride (SiON) layer on the surface of the tunneling oxide film 3 with a thickness of 3–4 nm. Thereby, the lifetime of the tunneling oxide film 3 increases substantially.

Next, a polysilicon layer 4 is deposited on the structure thus formed with a CVD process similar to the one used for the formation of the polysilicon layer 2, with a thickness of about 100 nm, except that the temperature is set at about 600° C., and a silicon nitride layer 5 is deposited on the structure thus formed with a thickness of about 30 nm by a CVD process, such that the layer 5 covers the exposed surface of the polysilicon layer 4 continuously as a result of thermal decomposition reaction between $SiH_4$ and ammonia. Further, another polysilicon layer 6 is deposited on the silicon nitride layer 5 by a CVD process similar to the process employed for the deposition of the layer 3, with a thickness of about 0.3 $\mu$m. Thereby, the structure shown in FIG. 2(B) is obtained.

Figure 2C:
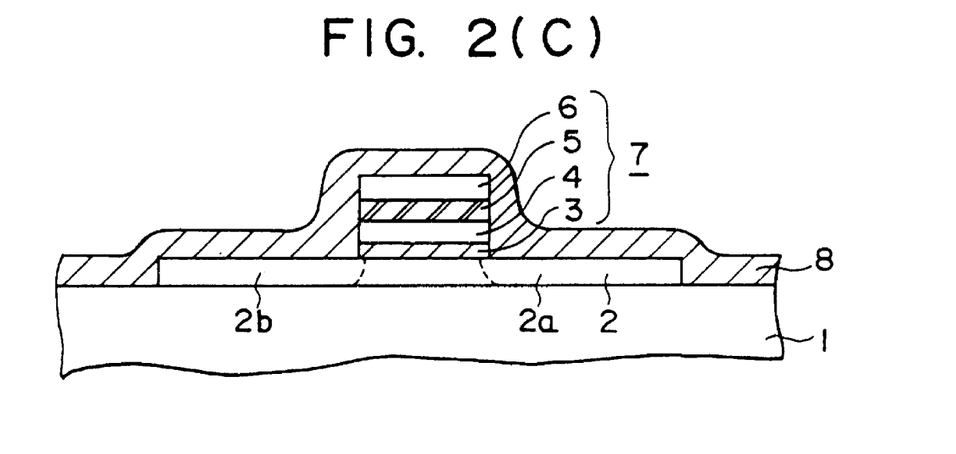

Next, the structure of FIG. 2(B) is subjected to a photolithographic patterning process, wherein the layers 3–6 are patterned to form a gate structure 7 shown in FIG. 2(C). In the illustrated example, the gate structure 7 has a gate length of about 0.5 $\mu$m. Thereby, the silicon oxide layer 3 forms the tunneling oxide layer 3, the polysilicon layer 4 forms the floating gate electrode 4, the silicon nitride layer 5 forms the interlayer insulation film 5, and the polysilicon layer 6 forms the control electrode 6, all shown in the structure of FIG. 1. Further, the structure thus patterned is subjected to an ion implantation process to incorporate $P^+$ into the control gate electrode 6 with an impurity concentration level of $10^{20} cm^{-3}$ such that the electrode 6 shows a high conductivity. Associated with the foregoing ion implantation process, $n^+$-type regions 2a and 2b are formed at both lateral sides of the gate structure 7. Thereby, the regions 2a and 2b act as the source and drain regions of the transistor thus formed.

Figure 2D:
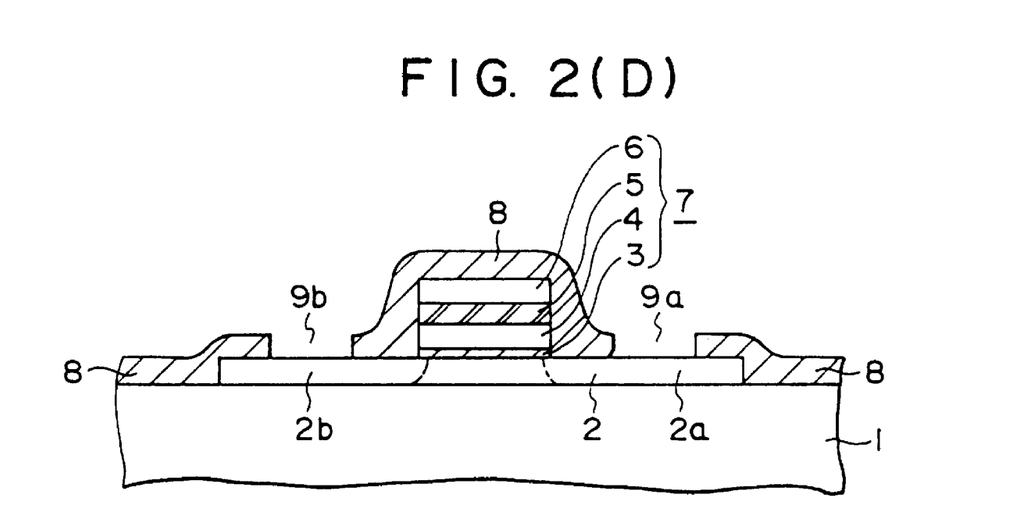

After the foregoing processes are completed, a silicon oxide film 8 is deposited by a CVD process as indicated in FIG. 2(C), wherein the silicon oxide film 8 forms the protective film 8 of FIG. 1. Further, the contact holes 9a and 9b are formed in the protective film 8 at both lateral Bides of the gate structure 7 such that the source and drain regions 2a and 2b are exposed in correspondence to the contact holes 9a and 9b. Thereby, the structure shown in FIG. 2(D) is obtained.

The attached photograph 1 shows the cross section of the structure thus fabricated, wherein the horizontal black band at the bottom merely shows the background. The bright layer above the black band shows the quartz glass substrate 1, while the partially bright layer above the quartz substrate 1 shows the polysilicon substrate layer 2. It will be noted that the gate structure 7 is provided on the polysilicon substrate layer 2.

In this photograph 1, it should be noted that the tunneling oxide layer 3, which is provided on the polysilicon layer 2 in correspondence to the gate structure 7, has a very small but uniform thickness, in spite of the existence of a grain boundary in the layer 2 that is shown by a dark band extending from the top surface to the bottom surface of the layer 2 in correspondence to the part located under the gate structure 7. The polysilicon substrate layer 2 shows a flat surface irrespective of the existence of the grain boundary, and the tunneling oxide film 3 shows a uniform thickness on the layer 2 as a result. From detailed microscopic study, it was confirmed that the projections or depressions at the surface of the polysilicon layer associated with such a grain boundary have a height smaller than about 1 nm, typically less than several Angstroms. It should be noted that the layer 2 shown in the photograph 1 is not applied with any additional planarizing processes such as mechanical or chemical polishing.

With the smooth surface obtained in the polysilicon substrate layer 2, one can provide the tunneling oxide film 3 with a reduced thickness, without increasing the leak current of the memory cell transistor.

Figure 3:
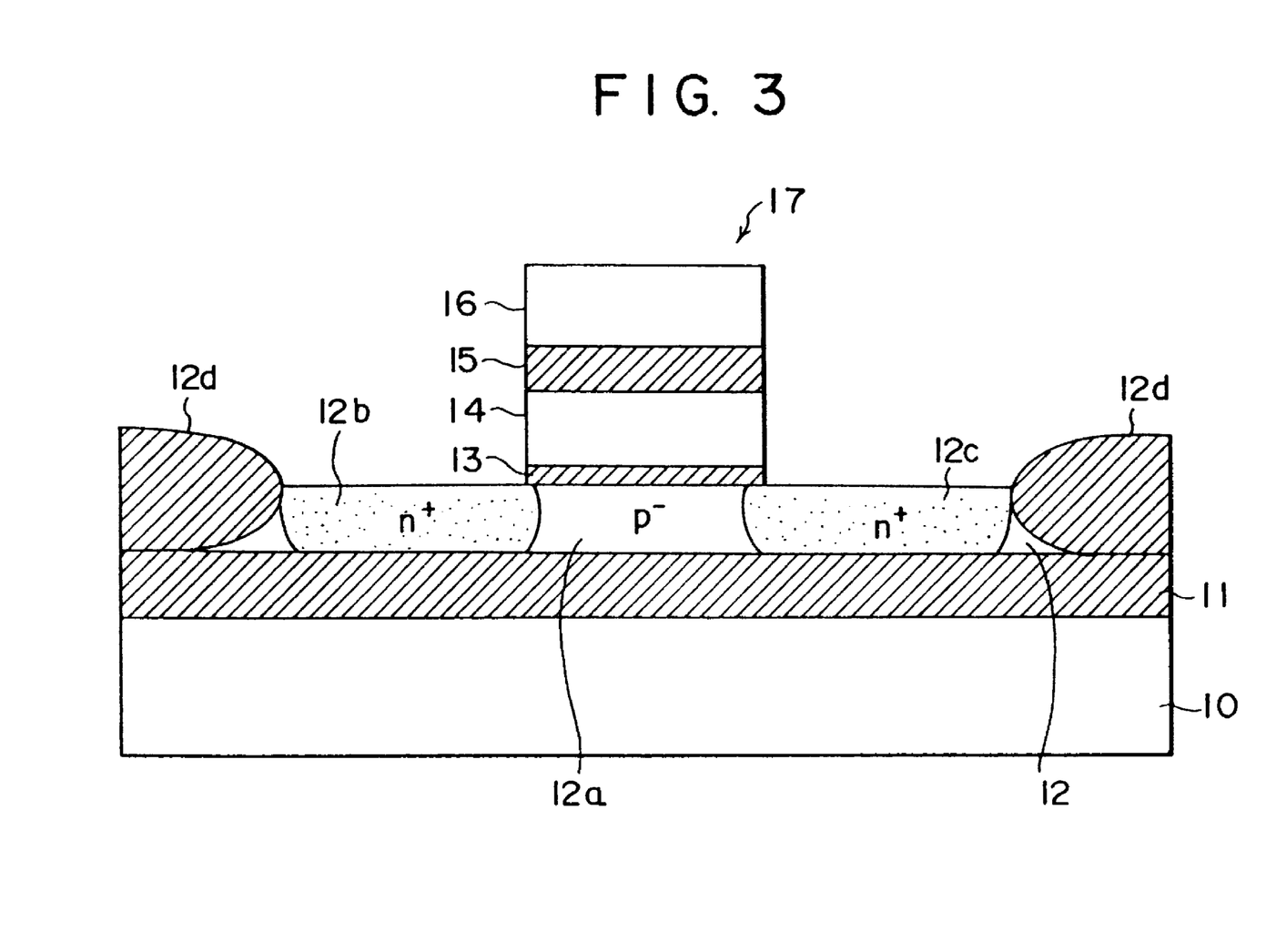
FIG. 3 is a diagram showing a memory cell transistor according to a third embodiment of the present invention.

FIG. 3 shows a second embodiment of the present invention, wherein the memory cell transistor of the present embodiment has a structure substantially identical with the transistor of FIG. 1 except that the polysilicon substrate is defined with source and drain regions having an opposite conductivity type to the channel region, as usual in conventional MOS transistors.

Referring to FIG. 3, the transistor is constructed on a single crystal silicon substrate 10 on which a silicon oxide layer 11 is formed by a thermal oxidation process with a thickness of about several thousand nanometers in correspondence to the quartz glass substrate 1 of FIG. 1. On the upper major surface of the silicon oxide layer 11, a polysilicon layer 12 doped to the p$^-$-type is deposited by a CVD process with a thickness of about 0.1 $\mu$m in correspondence to the polysilicon layer 2 of FIG. 1, wherein the polysilicon layer 12 is deposited in the form of amorphous silicon at a temperature of about 500° C. and recrystallized as a result of the thermal annealing process conducted at a temperature of about 600° C., similarly to the polysilicon layer 2.

On the upper major surface of the polysilicon layer 12, there is provided a gate structure 17, wherein the gate structure includes a tunneling oxide layer 13 formed by thermally oxidizing the surface of the polysilicon layer 12 at a temperature of about 1000° C. The layer 13 has a thickness of about 10 nm, and a floating gate electrode 14 of polysilicon corresponding to the floating gate electrode 4 is provided on the tunneling oxide layer 13. Typically, the floating gate electrode 14 has a thickness of about 100 nm, and an interlayer insulation film 15 of silicon nitride is deposited thereon with a thickness of about 20 nm. Thereby, the interlayer insulation film 15 corresponds to the insulation film 5 of FIG. 1. On the interlayer insulation film 5, there is provided a control gate electrode 16 of doped polysilicon, in correspondence to the control gate electrode 6 of FIG. 1, wherein the polysilicon electrode 16 is doped to the n$^+$-type. It should be noted that the gate structure 17 is patterned to have a gate length of about 0.5 $\mu$m, when measured in the lateral direction in the illustration of FIG. 3.

In the embodiment of FIG. 3, the polysilicon substrate layer 12 of n$^-$-type is doped to the n$^+$-type in correspondence to both sides of the gate structure 17, and in correspondence to this, a source region 12b and a drain region 12c, both of the n$^+$-type, are formed in the layer 12 at both sides of the gate structure 17. Thereby, there is formed a p$^-$-type channel region 12a in the polysilicon substrate layer 12 immediately under the gate structure 17. It should be noted that the source and drain regions 1b and 12c are formed as a result of the ion implantation of phosphorus that is employed for doping the control gate electrode 16 to have the n$^+$-type conductivity. Further, the memory cell transistors thus constructed on the polysilicon substrate 12 are isolated from each other by a field oxide film 12d that defines the device region.

The memory cell transistor of FIG. 3 has an advantageous feature in that, because of the formation of the depletion region associated with the p-n junction between the source region 12b or drain region 12c and the channel region 12a, the drain current does not flow through the device in the unbiased state, and the construction of large scale memory cell array by connecting the memory cell transistors in rows and columns by the word lines and bit lines can be achieved easily. As a result of use of the SOI structure that eliminates unwanted depletion regions at the bottom of the source and drain regions 12b and 12c, the device has a reduced parasitic capacitance and provides a high operational speed particularly when reading data.

Figure 4:
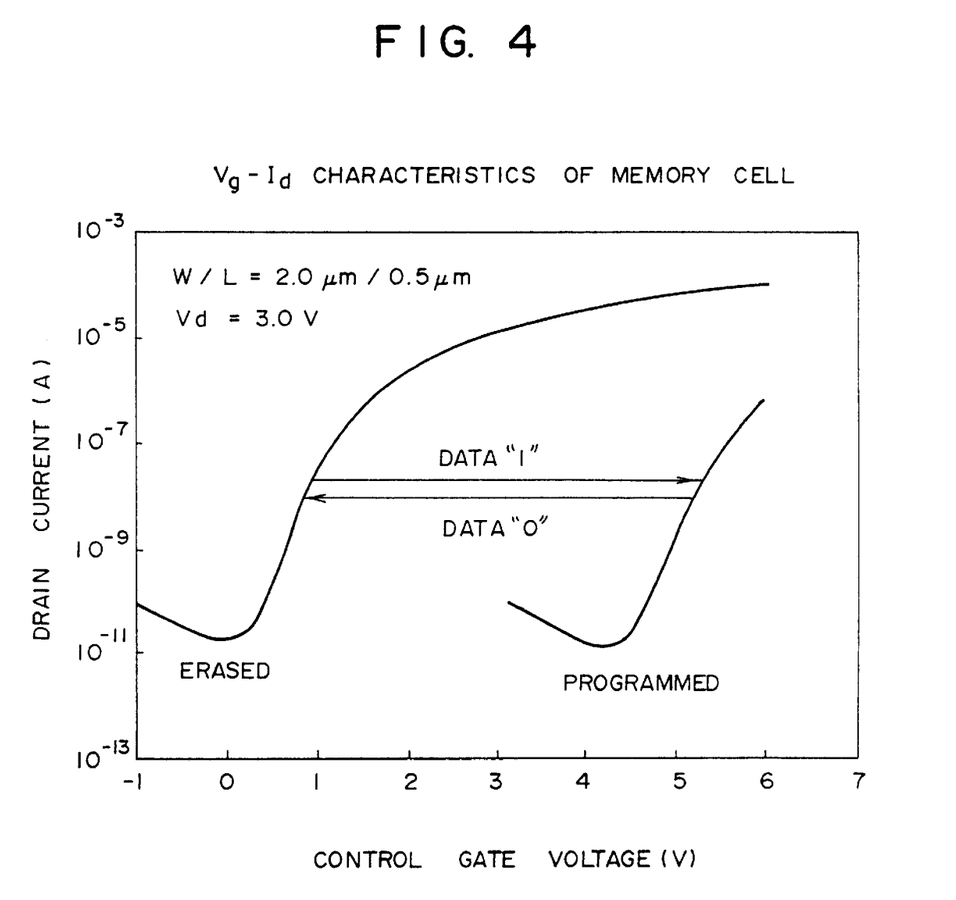
FIG. 4 is a diagram showing the operational characteristics of the memory cell transistor of FIG. 3.

FIG. 4 shows the memory operation of the transistor of FIG. 3, wherein the illustrated characteristics correspond to a device that has a gate length L of 0.5 $\mu$m and a gate width W of 2.0 $\mu$m. The measurement was conducted by applying a drain voltage $V_d$ of 3.0 volts.

As can be seen clearly, there exists a shift in the threshold characteristics of the device between a first state wherein no electrons are accumulated in the floating gate electrode 14 and a second state wherein electrons are accumulated in the floating gate electrode 14. The injection of the electrons to the floating gate electrode 14 is achieved by applying a read voltage pulse of +16 volts to the control electrode 16 with a pulse width of 10 $\mu$s, wherein the electrons are injected to the electrode 14 from the drain region 12c in the polysilicon substrate 12 via the tunneling oxide film 13 in the form of the Fowler-Nordheim tunneling current. On the other hand, the removal of the electrons from the floating gate electrode 14 is achieved in response to an erase voltage pulse of −9 volts to the control electrode 16, wherein the electrons are dissipated from the floating gate electrode 14 to the source region 12b in the polysilicon substrate layer 12 via the tunneling oxide film 13, similarly to the ordinary flash memory of the FLOTOX type.

It should be noted that the characteristics of FIG. 4 shows a threshold voltage of about 4.9 volts for writing data and a threshold voltage of about 1.3 volts for erasing data. Thereby, a shifting of the threshold of about 3.6 volts is obtained as a memory window or margin. As long as one set the voltage applied to the control gate during the reading process within this range, one can identify the state of the memory call transistor based upon the magnitude of the drain current $I_d$.

Figure 5:
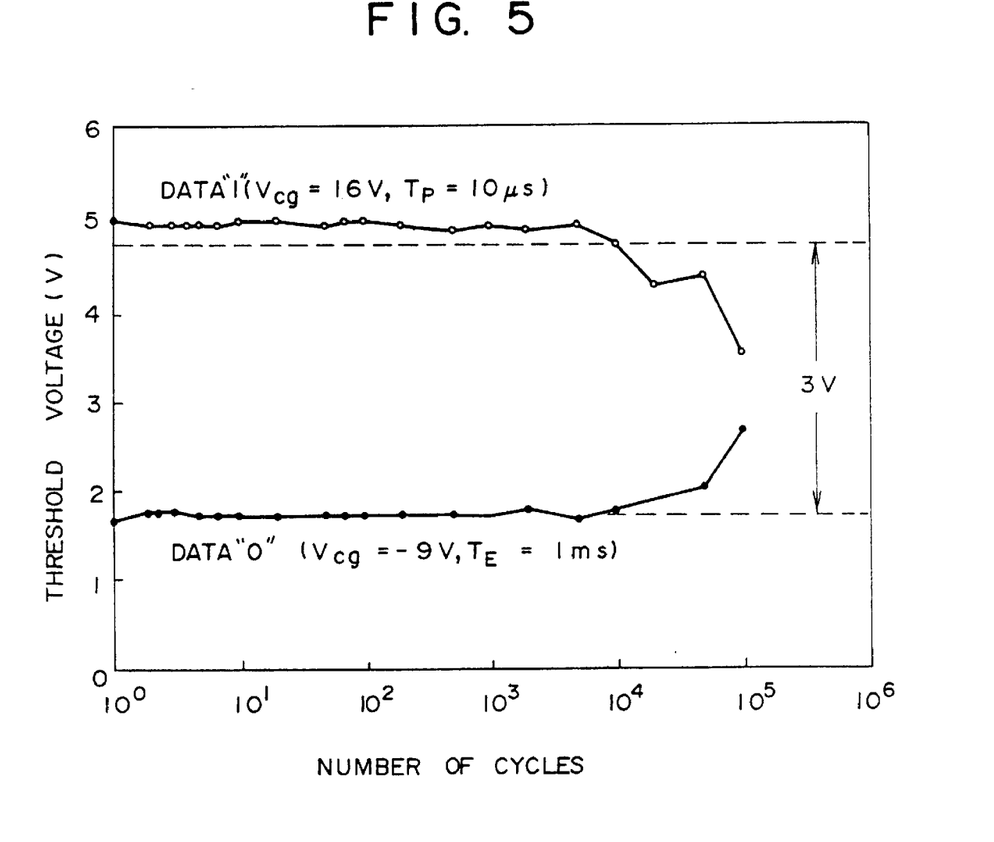
FIG. 5 is a diagram showing the variation of the threshold voltage of the memory cell transistor of FIG. 3 as a function of the number of repetitions of writing and erasing of data.

FIG. 5 shows the relationship between the threshold voltage and the number of write/erase cycles for the transistor of FIG. 3. As can be seen clearly in FIG. 5, a memory window of about 3 volts is maintained up to about 10$^4$ cycles, indicating the potential that the device can be used for replacing magnetic disk devices.

Although the device of FIG. 3 is constructed on a silicon oxide layer formed on a single crystal silicon substrate, it is of course possible to construct the device on a glass substrate similarly to the device of FIG. 1. Thus, the flash memory transistor of FIG. 3 can be fabricated with very small cost while maintaining the necessary performance.

Figure 6:
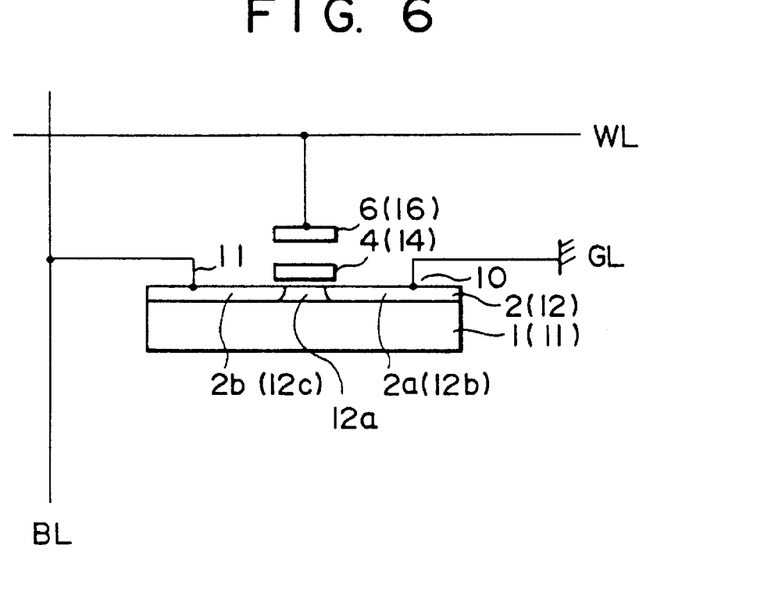
FIG. 6 is a circuit diagram showing a part of a memory cell array formed by the memory cell transistor of the present invention.

FIG. 6 shows an example of use of the memory, cell transistor of the present invention in a memory cell array forming a part of an LSI memory circuit, wherein a word line WL is connected to the control gate electrode 6 or 16 and a bit line BL is connected to the drain region 2b or 12c of the memory cell transistor. Further, the source region 2a or 12b is connected to the ground GL, commonly with other memory cell transistors.

Figure 7:
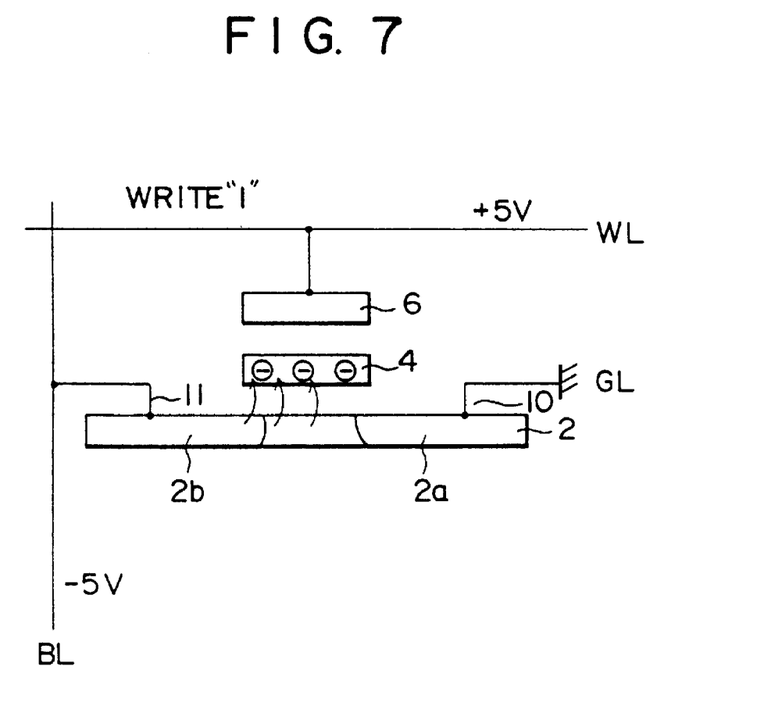
FIGS. 7–9 are circuit diagram showing the operation of the memory call array of FIG. 6.
Figure 8:
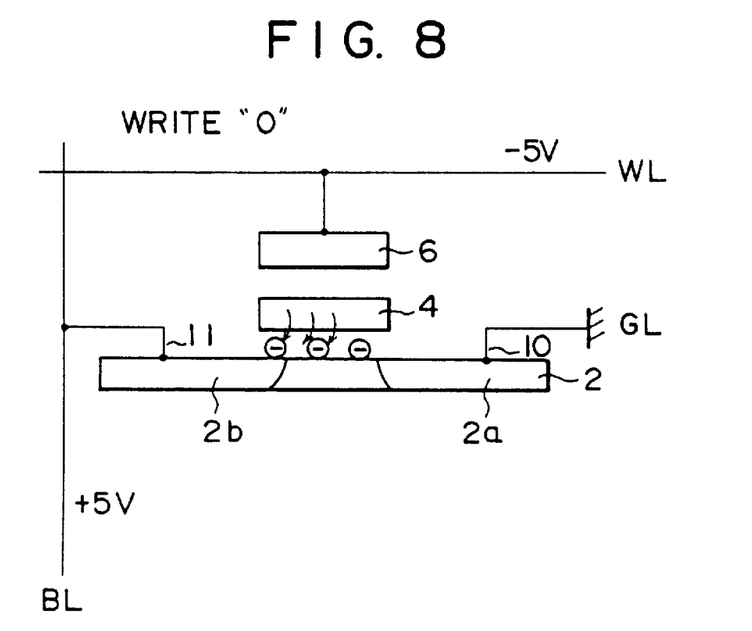
Figure 9:
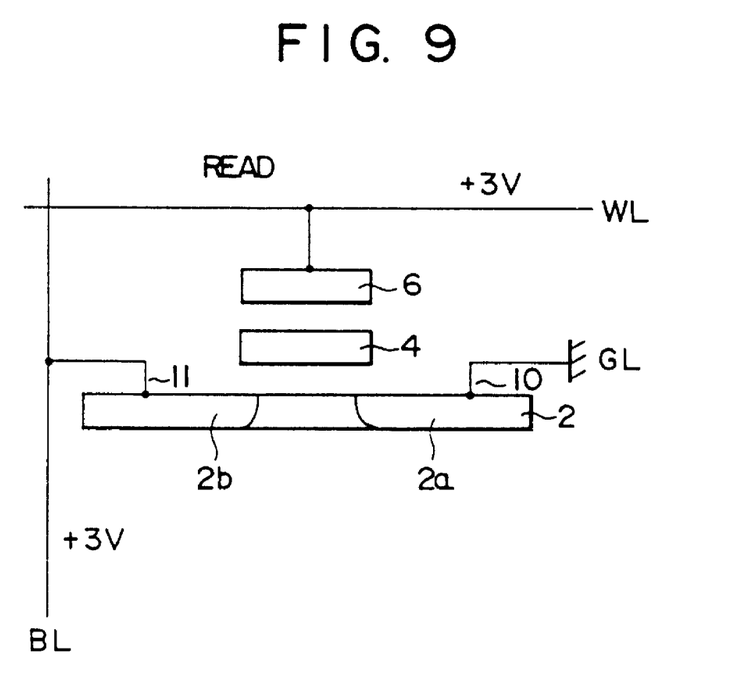

FIGS. 7–9 show the read, write and erase operation of the memory cell array. Although these drawings Show the operation for the memory cell transistor of FIG. 1, the sale description applies also to the memory call transistor of FIG. 3.

When wiring data "1" into the memory cell transistor, a positive voltage of about +5 volt is applied to the control gate electrode 6 and simultaneously a negative voltage of about −5 volts is applied to the drain region 2b as indicated in FIG. 7. Thereby, the electrons are infected to the floating gate electrode 4 as a result of the large voltage difference between the control gate electrode 6 and the drain region 2b.

FIG. 8 shows, on the other hand, writing of data "0" that is achieved by removing the electrons from the floating gate electrode 4. In the illustrated example, a positive voltage of about +5 volts is applied to the bit line BL while a negative voltage of about −5 volts is applied to the control gate electrode 6. Thereby, the electrons retained in the floating gate electrode 4 are dissipated to the bit line BL via the drain region 2b by causing a tunneling through the tunneling oxide film 3. Alternatively, one may apply a positive voltage to the source region 2a to remove the electrons to the ground GL as practiced in the common flash memories.

FIG. 9 shows the reading of data from the memory cell transistor. In FIG. 9, a small positive voltage of about +3 volts is applied to the control gate electrode 6 via the word line WL, and a small positive voltage of about +3 volts is applied to the drain region 2b via the bit line BL. Thereby, the minute variation of voltage on the bit line BL is detected by a sense amplifier not illustrated, and the state of the memory cell transistor is detected.

Figure 10:
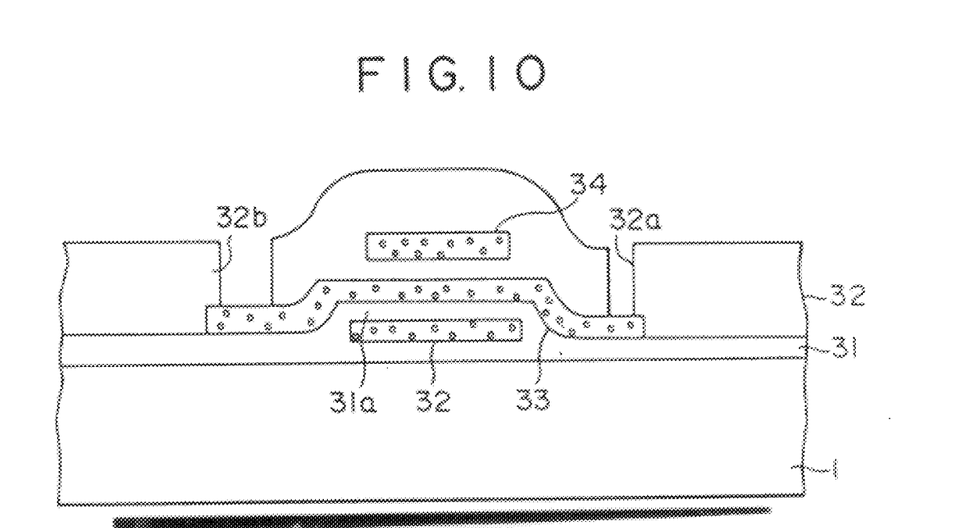
FIG. 10 is a diagram showing a variation of the memory cell transistor of the present invention.

FIG. 10 shows another variation of the device of the present invention, wherein the device is constructed on a glass substrate 1 similarly to the first embodiment.

On the glass substrate 1, there is provided a silicon oxide layer 31 in which a polysilicon floating gate 32 is embedded. The silicon oxide layer 31 covers the upper major surface of the floating gate electrode 32 with a thickness of about 10 nm in correspondence to a tunneling oxide region 31a so as to allow tunneling of the electrons therethrough, and a polysilicon layer 33 is deposited on the silicon oxide layer 31 such that the polysilicon layer 33 covers the floating gate electrode 32 underneath. The floating gate electrode 32 is formed of recrystallizing an amorphous silicon pattern and is characterized by a substantially flat, smooth upper major surface, wherein the height of the depressions and projections in held within several Angstroms.

The polysilicon layer 33 is doped for example to the p⁻-type and is buried under an insulating layer 32 in which a polysilicon control gate electrode 34 is embedded. Thereby, the electrode layer 34 is disposed above the floating gate electrode 32 across the doped polysilicon layer 33, and the insulating layer 32 is provided with contact holes 32a and 32b at both lateral sides of the electrode 34 so as to expose the upper major surface of the polysilicon layer 33. Further, the polysilicon layer 32 is doped to the n⁺-type in correspondence to the regions that are exposed by the contact holes 32a and 32b.

According to the construction of FIG. 10, one can control the tunneling of the electrons through the tunneling oxide region 31a between the floating gate electrode 32 and the polysilicon layer 33 effectively. Further, on may replace the electrodes 32 and 34 with each other in the construction of FIG. 10.

Further, the present invention is not limited to the embodiments described heretofore, but various variations and modifications may be made without departing from the scope of the present invention.

What is claimed is:

1. A semiconductor memory device for storing information in the form of electric charges, comprising:

an insulating substrate having upper and lower major surfaces;

a polycrystalline semiconductor layer having upper and lower major surfaces and provided on said upper major surface of said insulating substrate;

a source region defined in said polycrystalline semiconductor layer;

a drain region defined in said polycrystalline semiconductor layer with a separation from said source region;

said source and drain regions defining therebetween a channel region as a part of said polycrystalline layer; and a gate structure provided on said upper major surface of said polycrystalline semiconductor layer in correspondence to said channel region, said gate structure including:

a tunneling oxide film provided on said upper major surface of said polycrystalline semiconductor layer, said tunneling oxide film having a thickness to allow carriers to pass therethrough by a tunneling effect;

a floating gate electrode provided on an upper major surface of said tunneling oxide film, said floating gate electrode storing information in the form of electric charges;

an intervening insulation film provided on an upper major surface of said floating gate electrode; and a control electrode provided on an upper major surface of said intervening insulation film;

wherein said tunneling oxide film directly contacts grains of the polycrystalline semiconductor layer.

2. A semiconductor memory device as claimed in claim 1, wherein said semiconductor memory device further comprises:

a protective insulation layer provided on said polycrystalline semiconductor substrate so as to bury said gate structure underneath; and a source contact hole and a drain contact hole provided on said protective insulation layer at both sides of said gate structure for exposing said upper major surface of said polycrystal semiconductor substrata.

3. A semiconductor memory device as claimed in claim 2, wherein said upper major surface of said polycrystalline semiconductor layer includes irregularities having a height which is less than several Angstroms.

4. A semiconductor memory device as claimed in claim 2, wherein said polycrystalline semiconductor substrate is doped to have a single conductivity type.

5. A semiconductor memory device as claimed in claim 4, wherein said polycrystalline semiconductor substrate has an increased impurity concentration level in correspondence to regions that are exposed by said source and drain contact holes.

6. A semiconductor memory device as claimed in claim 2, wherein said polycrystalline semiconductor substrate has a first conductivity type in correspondence to a region thereof located immediately below said gate electrode and a second, opposite conductivity type in correspondence to regions that are exposed by said source and drain contact holes.

7. A semiconductor memory device as claimed in claim 1, wherein said polycrystalline semiconductor substrate comprises silicon.

8. A semiconductor memory device as claimed in claim 1, wherein said polycrystalline semiconductor substrate has a thickness of 0.1 µm or less.

9. A semiconductor memory device as claimed in claim 1, wherein said insulating substrate comprises a quartz glass plate.

* * * * *